(12) United States Patent
Takinami

(10) Patent No.: US 12,206,390 B2
(45) Date of Patent: Jan. 21, 2025

(54) GATE DRIVE CIRCUIT, TEST DEVICE, AND SWITCHING METHOD

(71) Applicant: SINTOKOGIO, LTD., Nagoya (JP)

(72) Inventor: Masayoshi Takinami, Nagoya (JP)

(73) Assignee: SINTOKOGIO, LTD., Nagoya (JP)

(\*) Notice: Subject to any disclaimer, the term of this patent is extended or adjusted under 35 U.S.C. 154(b) by 15 days.

(21) Appl. No.: 18/125,243

(22) Filed: Mar. 23, 2023

(65) Prior Publication Data

US 2023/0318592 A1    Oct. 5, 2023

(30) Foreign Application Priority Data

Mar. 29, 2022  (JP) .................. 2022-053871

(51) Int. Cl.
| | |
|---|---|
| H03K 17/04 | (2006.01) |
| G01R 31/26 | (2020.01) |
| H03K 17/041 | (2006.01) |
| H03K 17/66 | (2006.01) |
| H03K 17/06 | (2006.01) |

(52) U.S. Cl.
CPC ... *H03K 17/04113* (2013.01); *G01R 31/2601* (2013.01); *H03K 17/661* (2013.01); *H03K 2017/066* (2013.01)

(58) Field of Classification Search
None
See application file for complete search history.

(56) References Cited

U.S. PATENT DOCUMENTS

| | | | | |
|---|---|---|---|---|
| 6,333,665 | B1* | 12/2001 | Ichikawa | H03K 17/168 327/434 |
| 7,554,385 | B2* | 6/2009 | Ishida | H02M 3/07 327/170 |
| 8,203,377 | B2* | 6/2012 | Kelley | H03K 17/04123 327/170 |
| 9,800,235 | B2* | 10/2017 | Tang | H03K 19/00315 |
| 10,651,723 | B1* | 5/2020 | Frank | H03K 17/687 |
| 11,115,019 | B2* | 9/2021 | Lu | H03K 17/0828 |

FOREIGN PATENT DOCUMENTS

JP    2017-067555 A    4/2017

\* cited by examiner

*Primary Examiner* — Jeffrey S Zweizig
(74) *Attorney, Agent, or Firm* — Faegre Drinker Biddle & Reath LLP

(57) ABSTRACT

A gate drive circuit is used in a dynamic characteristic test on a power semiconductor, the gate drive circuit includes a voltage source configured to change a gate voltage of a gate of the power semiconductor, a plurality of resistance setting circuits connected in parallel with the voltage source and the gate, and a switching circuit connecting at least one resistance setting circuit of the resistance setting circuits to the voltage source and the gate.

3 Claims, 5 Drawing Sheets

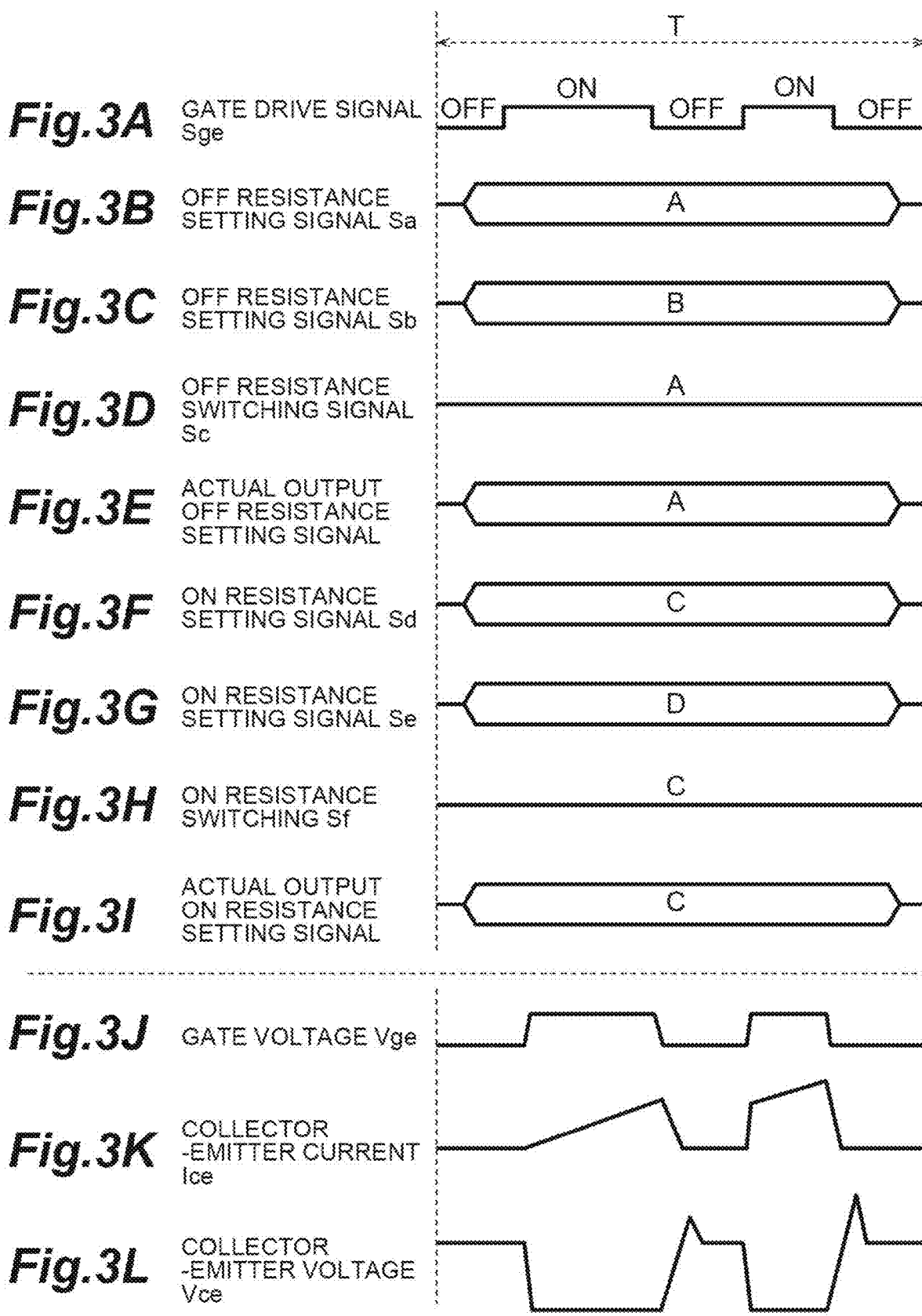

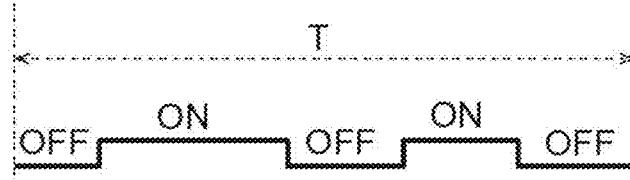
Fig.4A  GATE DRIVE SIGNAL Sge

Fig.4B  OFF RESISTANCE SETTING SIGNAL Sa

Fig.4C  OFF RESISTANCE SETTING SIGNAL Sb

Fig.4D  OFF RESISTANCE SWITCHING SIGNAL Sc

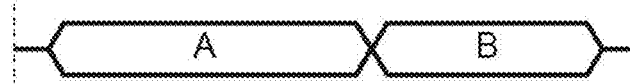
Fig.4E  ACTUAL OUTPUT OFF RESISTANCE SETTING SIGNAL

Fig.4F  ON RESISTANCE SETTING SIGNAL Sd

Fig.4G  ON RESISTANCE SETTING SIGNAL Se

Fig.4H  ON RESISTANCE SWITCHING Sf

Fig.4I  ACTUAL OUTPUT ON RESISTANCE SETTING SIGNAL

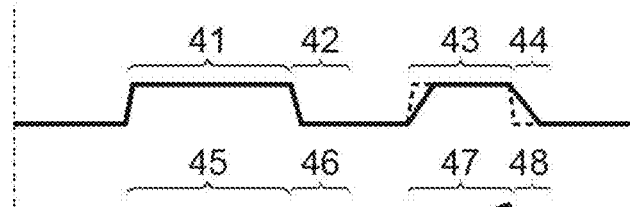
Fig.4J  GATE VOLTAGE Vge

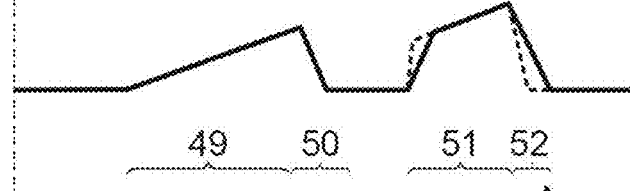
Fig.4K  COLLECTOR-EMITTER CURRENT Ice

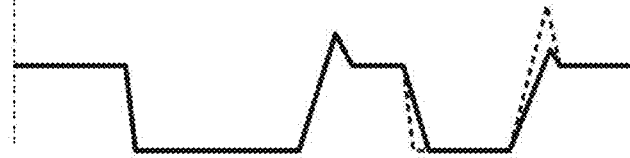
Fig.4L  COLLECTOR-EMITTER VOLTAGE Vce

GATE DRIVE CIRCUIT, TEST DEVICE, AND SWITCHING METHOD

CROSS-REFERENCE TO RELATED APPLICATION

This application is based on Japanese Patent Application No. 2022-053871 filed with Japan Patent Office on Mar. 29, 2022, the entire contents of which are hereby incorporated by reference.

TECHNICAL FIELD

The present invention relates to a gate drive circuit, a test device, and a switching method.

BACKGROUND

A test device for a power semiconductor disclosed in Japanese Unexamined Patent Publication No. 2017-67555 is formed in such a way that at least one of a plurality of units for use in measurement during a test is attachable/detachable. According to a required measurement item of the test, a necessary unit is mounted and an unnecessary unit is removed.

SUMMARY

In the device disclosed in Japanese Unexamined Patent Publication No. 2017-67555, attaching/detaching work is required for a configuration change according to a measurement item of a dynamic characteristic test on a power semiconductor. Therefore, the test may take time. The present invention provides a technology for efficiently conducting a test on a power semiconductor.

A gate drive circuit according to one aspect of an embodiment is used in a dynamic characteristic test on a power semiconductor. The gate drive circuit includes a voltage source configured to change a gate voltage of a gate of the power semiconductor, a plurality of resistance setting circuits connected in parallel with the voltage source and the gate, and a switching circuit connecting at least one resistance setting circuit of the resistance setting circuits to the voltage source and the gate.

According to the embodiment, a technology for efficiently conducting a dynamic characteristic test on a power semiconductor can be provided.

BRIEF DESCRIPTION OF THE DRAWINGS

FIGS. 3A-3L are diagrams showing an example of signals regarding the test device according to the embodiment;

FIGS. 4A-4L are diagrams illustrating another example of signals regarding the test device according to the embodiment.

DETAILED DESCRIPTION

Embodiment

Figure 1:
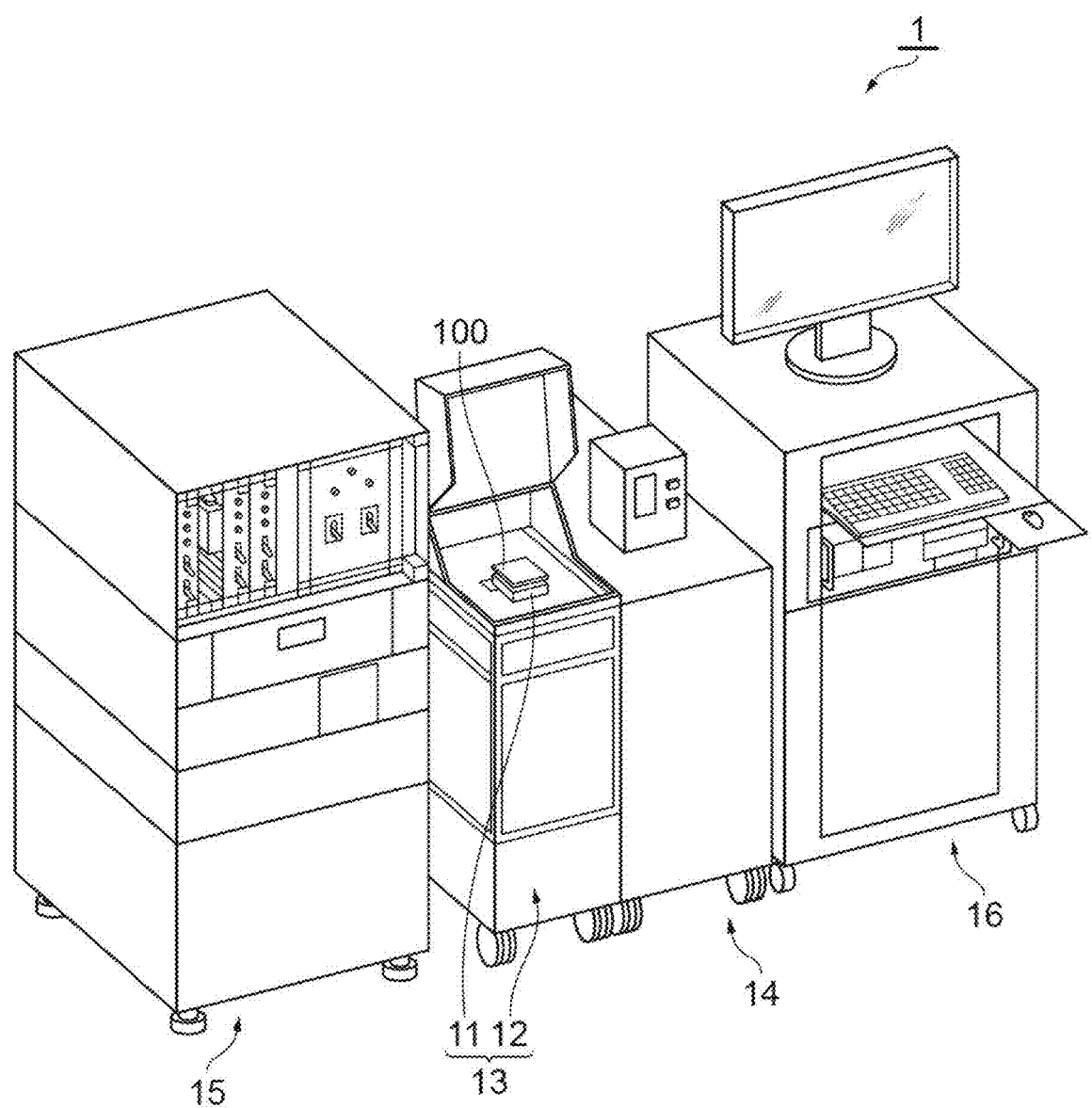
FIG. 1 is a diagram illustrating the external appearance of a device including a test device according to an embodiment.

Hereinafter, an embodiment will be explained with reference to the drawings. It is to be noted that, in the following explanation, identical or corresponding elements are denoted by the same reference numeral, and a redundant explanation thereof will be omitted. Throughout the drawings, a dimensional ratio does not necessarily match with that explained in the description. The terms "up", "down", "left", and "right" are based on a situation in each of the drawings, and are used for convenience.

FIG. 1 is a diagram illustrating the external appearance of a test device according to the embodiment. A test device 1 includes a first casing 13, a second casing 14, a third casing 15, and a fourth casing 16, for example. The first casing 13 includes a body section 12 and a connection section 11 connecting a power semiconductor 100 to the test device 1. Alternatively, the test device 1 may be formed of a single casing.

The connection section 11 has a probe, for example, and is connectable to a power semiconductor of any physical shape. The body section 12 includes a gate drive circuit 3 and a sensor 4, which will be explained later, for example.

For example, a casing for testing a static characteristic of the power semiconductor 100 is used as the third casing 15. For example, the second casing 14 has a controller 2 which will be explained later. For example, the fourth casing 16 has input units such as a keyboard and a mouse for allowing a user of the test device 1 to perform test settings.

For example, the fourth casing 16 has a presentation unit (e.g. at least one of a loudspeaker, a microphone, and a display) for performing settings and/or confirming settings. For example, the input unit and the presentation unit are used when a user of the test device 1 sets a resistance value, which will be explained later.

Figure 2:
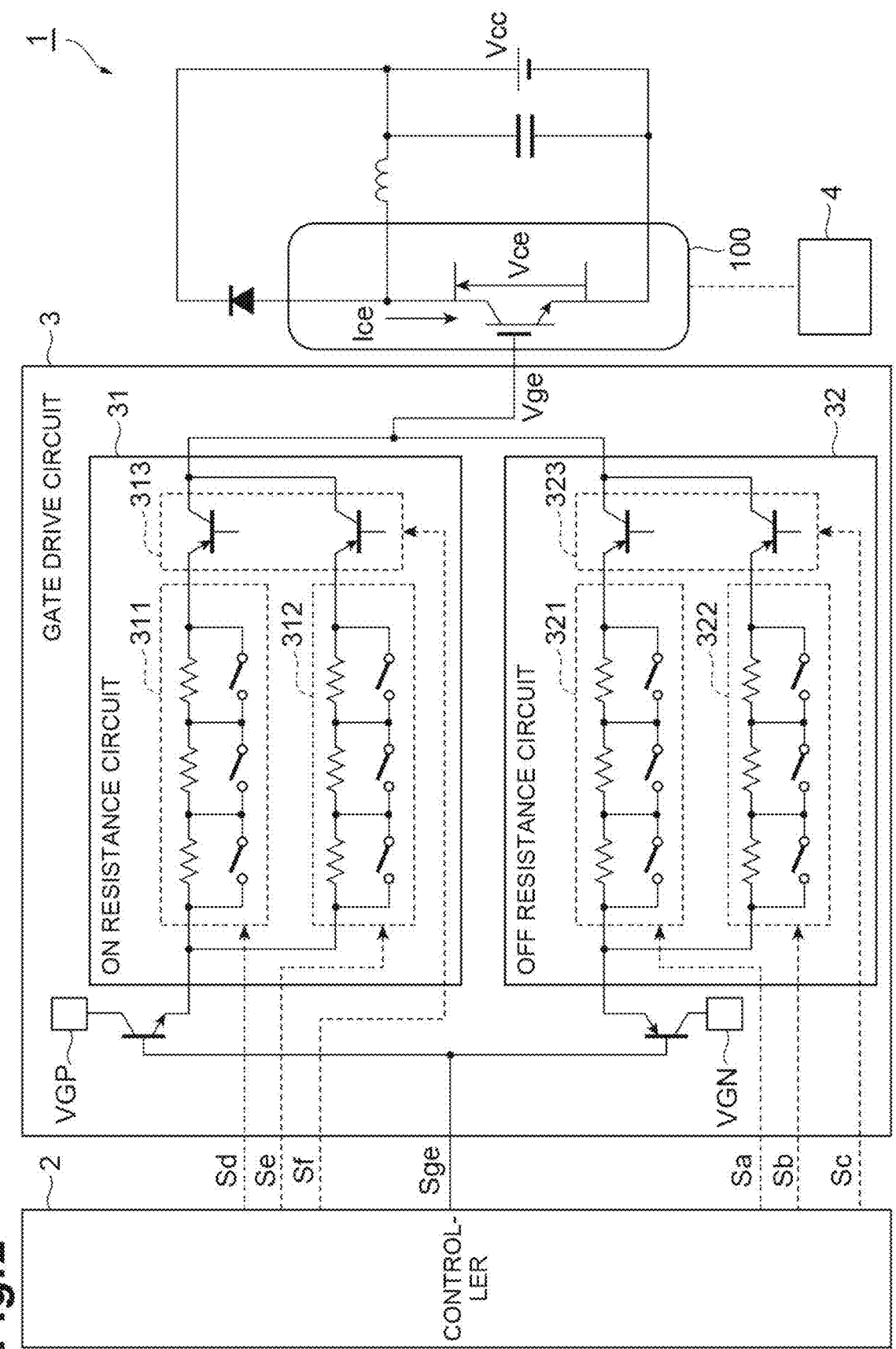
FIG. 2 is a diagram illustrating a circuit diagram example of the test device according to the embodiment.

FIG. 2 is a diagram illustrating a circuit diagram example of the test device 1 according to the embodiment. The test device 1 illustrated in FIG. 2 is used to conduct a test on the power semiconductor 100. For example, to control a motor, a light, or a battery, the power semiconductor 100 performs power conversion such as converting AC current to DC current or stepping down a voltage to 5 or 3 V. The power semiconductor 100 uses high voltage or large current.

For example, an insulated gate bipolar transistor (IGBT) having an emitter, a collector, and a gate, is used as the power semiconductor 100. Tests on the power semiconductor 100 include a static characteristic (DC: Direct Current) test and a dynamic characteristic (AC: Alternating Current) test.

In a static characteristic test on the power semiconductor 100, voltage or current being applied to the power semiconductor 100 is fixed, and thus, voltage or current being applied to the power semiconductor 100 is not changed.

In a dynamic characteristic test on the power semiconductor 100, voltage or current being applied to the power semiconductor 100 changes, and thus, voltage or current being applied to the power semiconductor 100 is changed.

For example, characteristics such as total gate electric charges, a collector breaking current, a gate-emitter threshold voltage, a gate-emitter leakage current, and a collector-emitter voltage Vce in the power semiconductor 100 can be measured in a static characteristic test. For example, the collector-emitter voltage Vce refers to a voltage between a collector and an emitter.

For example, characteristics such as a turning-on delay time, a turning-on step-up time, a turning-off delay time, a turning-off step-down time, a reverse recovery time, and a reverse recovery electric charge are measured, and switching measurement and high short-circuit resistance measurement in the power semiconductor 100 are conducted, in a dynamic characteristic test. For example, turning-on indicates starting power application to the power semiconductor 100, and turning-off indicates stopping power application to the power semiconductor 100.

Measurement items of a static characteristic test and a dynamic characteristic test are selected, as appropriate, according to specifications requested by a user. Hereinafter, a dynamic characteristic test of measuring the collector-emitter voltage Vce of the power semiconductor 100 will be explained, for example. However, the embodiment is not limited to the dynamic characteristic test.

As illustrated in FIG. 2, the test device 1 includes the controller 2 that performs a switching process which will be explained later, and the gate drive circuit 3 and the sensor 4. The controller 2 is connected to the gate drive circuit 3, for example.

The controller 2 outputs a gate signal Sge to control the ON/OFF of a gate of the power semiconductor 100. For example, a pulse signal consisting of an ON signal which indicates the ON state of the gate of the power semiconductor 100 and an OFF signal which indicates the OFF state of the gate of the power semiconductor 100, is used as the gate signal Sge. The ON signal is 1, for example. The OFF signal is 0, for example.

In the gate drive circuit 3, in accordance with the gate signal Sge outputted from the controller 2, a gate voltage Vge is applied to the gate of the power semiconductor 100. The controller 2 is capable of outputting not only the gate signal Sge but also any other signal, which will be explained later, for driving a constituent element of the gate drive circuit 3.

Hardware of the controller 2 is not limited to particular hardware as long as the controller 2 is capable of outputting a signal. The controller 2 may be formed as a computer including a CPU (Central Processing Unit), a ROM (Read only memory), a RAM (Random Access Memory), etc., for example, or may be formed of a PLC (Programmable Logic Controller) or an FPGA (Field Programmable Gate Array).

The gate drive circuit 3 includes a voltage source, a plurality of resistance setting circuits, and a switching circuit. For example, the gate drive circuit 3 is used for a dynamic characteristic test in which the power semiconductor 100 is a test target. For example, the collector-emitter voltage Vce changes with a change of the gate voltage Vge in the power semiconductor 100 caused by voltage applied from the voltage source. It is considered that the gate voltage Vge changes in accordance with a voltage applied from the voltage source.

For example, the plurality of resistance setting circuits are connected in parallel with the voltage source and the gate, and the switching circuit connects at least one of the resistance setting circuits to the voltage source and the gate. A circuit including the resistance setting circuits and the switching circuit may be referred to as a resistance circuit. For example, the resistance circuit is at least one of an ON resistance circuit 31 and an OFF resistance circuit 32 which will be explained later.

For example, the voltage source is an ON voltage source VGP or an OFF voltage source VGN which will be explained later. For example, a plurality of the resistance circuits is ON resistance setting circuits 311, 312 or OFF resistance setting circuits 321, 322 which will be explained later. For example, the switching circuit is an ON resistance switching circuit 313 or an OFF resistance switching circuit 323 which will be explained later.

In the gate drive circuit 3, in accordance with the gate signal Sge outputted from the controller 2, the gate voltage Vge is applied to the gate of the power semiconductor 100 in such a way that the gate of the power semiconductor 100 is turned ON/OFF. Accordingly, for example, the collector-emitter voltage Vce of the power semiconductor 100 is changed. The gate drive circuit 3 includes an ON voltage source VGP and an ON resistance circuit 31 that are structures to operate when the gate signal Sge is set to an ON signal.

For example, the ON voltage source VGP is connected to the ON resistance circuit 31 via a semiconductor element such as a transistor having an emitter, a collector, and a base. The ON resistance circuit 31 is a gate resistor having a preset resistance value. The gate resistor restricts a current flowing to the gate of the power semiconductor 100.

The preset resistance value is a value that is set prior to the dynamic characteristic test, and is determined according to the contents of the dynamic characteristic test. Hereinafter, the transistor is a bipolar transistor having an emitter, a collector, and a base, for example, unless otherwise noted.

For example, the ON resistance circuit 31 includes resistors connected in series, and switches and relays prepared for the respective resistors. The controller 2 outputs OFF resistance setting signals Sa, Sb and ON resistance setting signals Sd, Se for controlling the relays of the respective resistors. The OFF resistance setting signals Sa, Sb and the ON resistance setting signals Sd, Se, etc. may be simply referred to as resistance setting signals.

The controller 2 outputs an OFF resistance switching signal Sc and an ON resistance switching signal Sf. The controller 2 previously sets the resistance values of the gate resistors of the ON resistance circuit 31 and the OFF resistance circuit 32 prior to the dynamic characteristic test. The OFF resistance switching signals Sc and/or the ON resistance switching signal Sf may be simply referred to as a resistance switching signal.

In the gate drive circuit 3, in a case where the gate signal Sge is set to an ON signal, the transistor connected to the ON voltage source VGP operates, a voltage is applied from the ON voltage source VGP to the ON resistance circuit 31, and, for example, the collector-emitter voltage Vce changes with a change of the gate voltage Vge of the power semiconductor 100. For example, in the dynamic characteristic test on the power semiconductor 100, the ON resistance circuit 31 can change a gate driving condition for turning on the gate voltage Vge.

The ON resistance circuit 31 includes a plurality of resistance setting circuits connected in parallel with the ON voltage source VGP and the gate of the power semiconductor 100. For example, the ON resistance circuit 31 includes the first resistance setting circuit 311 and the second resistance setting circuit 312, as illustrated in FIG. 2. Hereinafter, the first resistance setting circuit 311 may be referred to as ON resistance setting circuit, and the second resistance setting circuit 312 may be referred to as an ON resistance setting circuit.

The first resistance setting circuit 311 and the second resistance setting circuit 312 are gate resistors each having a preset resistance value. The first resistance setting circuit 311 includes resistors connected in series, and switches and relays prepared for the respective resistors. The controller 2 outputs an ON resistance setting signal Sd to control the relays of the first resistance setting circuit 311.

Like the first resistance setting circuit 311, the second resistance setting circuit 312 includes resistors connected in series, and switches and relays prepared for the respective resistors. The controller 2 outputs an ON resistance setting signal Se to control the relays of the second resistance setting circuit 312. The resistance values of the gate resistors (a first resistor and a second resistor) of the first resistance setting circuit 311 and the second resistance setting circuit 312 are previously set prior to the dynamic characteristic test.

The controller 2 previously sets the ON resistance setting signals Sd, Se to control the relays for the respective ON resistors in such a way that the value of the first resistor of the first resistance setting circuit 311 becomes different from the value of the second resistor of the second resistance setting circuit 312.

For example, the ON resistance circuit 31 includes an ON resistance switching circuit 313 that connects at least one of the plurality of resistance setting circuits to the ON voltage source VGP and the gate of the power semiconductor 100. In FIG. 2, the ON resistance switching circuit 313 performs switching between the first resistance setting circuit 311 and the second resistance setting circuit 312.

The ON resistance switching circuit 313 is disposed on an output side of the first resistance setting circuit 311 and the second resistance setting circuit 312. For example, the ON resistance switching circuit 313 may include a semiconductor element that operates in accordance with the ON resistance switching signal Sf outputted from the controller 2, as illustrated in FIG. 2. For example, the semiconductor element is a transistor.

In a case where the gate signal Sge is set to an ON signal, when the transistor connected to the ON signal VGP operates, the ON resistance circuit 31 operates. In addition, the gate voltage Vge is determined on the basis of the voltage being applied by the ON voltage source VGP and the resistance value of the ON resistance circuit 31 determined in accordance with the ON resistance switching signal Sf. The gate voltage Vge is applied to the gate of the power semiconductor 100.

For example, the controller 2 outputs an ON resistance switching signal Sf during one test (e.g., one dynamic characteristic test), the test being from the start to end of the gate signal Sge. The ON resistance switching circuit 313 connects a resistance setting circuit selected between the first resistance setting circuit 311 and the second resistance setting circuit 312 in accordance with the ON resistance switching signal Sf, to the ON voltage source VGP and the gate of the power semiconductor 100. For example, the one test in the present embodiment means a period of time in which an arbitrary gate signal Sge is being transmitted.

The gate drive circuit 3 includes the OFF voltage source VGN and the OFF resistance circuit 32 that are structures to operate when the gate signal Sge is set to an OFF signal. The OFF voltage source VGN is connected to the OFF resistance circuit 32 via a semiconductor element such as a transistor, for example. In the dynamic characteristic test on the power semiconductor 100, the OFF resistance circuit 32 can change a gate driving condition for turning off the gate voltage Vge.

The OFF resistance circuit 32 includes a plurality of resistance setting circuits connected in parallel with the OFF voltage source VGN and the gate of the power semiconductor 100. For example, the OFF resistance circuit 32 includes a third resistance setting circuit 321 and a fourth resistance setting circuit 322, as illustrated in FIG. 2. Hereinafter, the third resistance setting circuit 321 may be referred to as OFF resistance setting circuit, and the fourth resistance setting circuit 322 may be referred to as an OFF resistance setting circuit.

The third resistance setting circuit 321 and the fourth resistance setting circuit 322 are gate resistors each having a preset resistance value. The third resistance setting circuit 321 includes resistors connected in series, and switches and relays prepared for the respective resistors. The controller 2 outputs an OFF resistance setting signal Sa to control the relays of the third resistance setting circuit 321.

Like the third resistance setting circuit 321, the fourth resistance setting circuit 322 includes resistors connected in series, and switches and relays prepared for the respective resistors. The controller 2 outputs an OFF resistance setting signal Sb to control the relays of the resistors of the fourth resistance setting circuit 322. The resistance values of the gate resistors (a third resistor and a fourth resistor) of the third resistance setting circuit 321 and the fourth resistance setting circuit 322 are previously set prior to the dynamic characteristic test.

The controller 2 previously sets the OFF resistance setting signals Sa, Sb to control the relays of the OFF resistors in such a way that the value of the third resistor of the third resistance setting circuit 321 becomes different from the value of the fourth resistor of the fourth resistance setting circuit 322.

For example, the OFF resistance circuit 32 includes an OFF resistance switching circuit 323 that connects at least one of the plurality of resistance setting circuits to the OFF voltage source VGN and the gate of the power semiconductor 100. In FIG. 2, the OFF resistance switching circuit 323 performs switching between the third resistance setting circuit 321 and the fourth resistance setting circuit 322.

The OFF resistance switching circuit 323 is disposed on an output side of the third resistance setting circuit 321 and the fourth resistance setting circuit 322. For example, the OFF resistance switching circuit 323 may include a semiconductor element that operates in accordance with the OFF resistance switching signal Sc outputted from the controller 2, as illustrated in FIG. 2. For example, the semiconductor element is a transistor.

In a case where the gate signal Sge is set to an OFF signal, when the transistor connected to the OFF signal VGN operates, the OFF resistance circuit 32 operates. The gate voltage Vge is determined on the basis of the voltage being applied by the OFF voltage source VGN and the resistance value of the OFF resistance circuit 32 determined in accordance with the OFF resistance switching signal Sc. The gate voltage Vge is applied to the gate of the power semiconductor 100.

For example, the controller 2 outputs the OFF resistance switching signal Sc during one test (e.g. one dynamic characteristic test), the test being from the start to end of the gate signal Sge. The OFF resistance switching circuit 323 connects a resistance setting circuit selected between the third resistance setting circuit 321 and the fourth resistance setting circuit 322 in accordance with the OFF resistance switching signal Sc, to the OFF voltage source VGN and the gate of the power semiconductor 100. For example, with switching circuits such as the ON resistance switching circuit 313 and the OFF resistance switching circuit 323, the gate resistor is dynamically switched during one test which is, for example, one dynamic characteristic test.

The sensor 4 is a voltmeter that measures the collector-emitter voltage Vce in the power semiconductor 100. On the basis of the detection result obtained by the sensor 4, a dynamic characteristic test of detecting a change of the collector-emitter voltage Vce, for example, is conducted.

First, an example in which gate resistance switching will not be caused during a dynamic characteristic test will be explained. FIGS. 3A-3L are examples of signals regarding the test device 1. FIG. 3A indicates the gate signal Sge. As shown by FIG. 3A, the gate signal Sge is a pulse signal the ON and OFF times of which are repeated. A period T from the start to end of the gate signal Sge is regarded as one test which is, for example, one dynamic characteristic test. For example, the time period T is set to several tens of μs.

FIG. 3B indicates the OFF resistance setting signal Sa which is one example of a value of the third resistor of the third resistance setting circuit 321. FIG. 3C indicates the OFF resistance setting signal Sb which indicates a value B of the fourth resistor of the fourth resistance setting circuit 322. The third resistor value A and the fourth resistor value B are fixed values because these values are determined prior to start of the dynamic characteristic test and are not changed during the dynamic characteristic test.

FIG. 3D indicates an example of the OFF resistance switching signal Sc. FIG. 3E indicates an actual output OFF resistance setting signal which is for controlling a gate resistor value that is actually outputted from the gate drive circuit 3 in the one test.

As shown by FIG. 3D, the OFF resistance switching signal Sc is set to a fixed value. In a case where the OFF resistance switching signal Sc is set to a fixed value, gate resistance switching in the OFF resistance circuit 32 is not caused during the dynamic characteristic test.

Since gate resistance switching in the OFF resistance circuit 32 is not caused during the dynamic characteristic test, the resistance value of the gate resistor of the OFF resistance circuit 32 is set to the third resistance value A during the dynamic characteristic test, as shown by FIG. 3E.

FIG. 3F indicates the ON resistance setting signal Sd which indicates a value C of the first resistor of the first resistance setting circuit 311. FIG. 3G indicates the ON resistance setting signal Se which indicates a value D of the second resistor of the second resistance setting circuit 312. The first resistor value C and the second resistor value D are fixed values because these values are determined prior to start of the dynamic characteristic test, and are not changed during the dynamic characteristic test.

FIG. 3H indicates an example of the ON resistance switching signal Sf. FIG. 3I indicates an actual output ON resistance setting signal which is for controlling a gate resistor value that is actually outputted from the gate drive circuit 3 during the one test.

The ON resistance switching signal Sf is set to a fixed value, as shown by FIG. 3H. In a case where the ON resistance switching signal Sf is set to a fixed value, gate resistance switching in the ON resistance circuit 31 is not caused during the dynamic characteristic test.

Since gate resistance switching in the ON resistance circuit 31 is not caused during the dynamic characteristic test, the resistor value of the gate resistance of the ON resistance circuit 31 is set to the first resistor value C during the dynamic characteristic test, as shown by FIG. 3I.

FIG. 3J indicates the gate voltage Vge, FIG. 3G indicates a collector-emitter current Ice which is current flowing between a collector and an emitter, and FIG. 3L indicates the collector-emitter voltage Vce. A dynamic characteristic is evaluated in view of FIG. 3J to FIG. 3L, for example.

Next, an example in which gate resistance switching is caused during a dynamic characteristic test will be explained. FIGS. 4A-4L illustrate another example of signals regarding the test device 1. FIGS. 4A-4L correspond to FIGS. 3A-3L. As shown by FIG. 4D, the OFF resistance switching signal Sc is a signal for switching from the value A of the third resistor to the value B of the fourth resistor. As shown by FIG. 4H, the ON resistance switching signal Sf is a signal for switching from the value C of the first resistor to the value D of the second resistor.

To switch the gate resistor value from the value A of the third resistor to the value B of the fourth resistor, gate resistance switching is caused during the dynamic characteristic test. As shown by FIG. 4E, the gate resistor value of the OFF resistance circuit is set from the value A of the third resistor to the value B of the fourth resistor during the dynamic characteristic test.

To switch the gate resistor value from the value C of the first resistor to the value D to the second resistor, gate resistance switching is caused during the dynamic characteristic test. As shown by FIG. 4I, the gate resistor value of the ON resistance circuit is set from the value C of the first resistor to the value D to the second resistor during the dynamic characteristic test.

Broken lines in FIGS. 4J-4L show the results of FIGS. 3J-3L. As shown by FIG. 4J, two waveforms: a waveform 42 corresponding to the value A of the third resistor and a waveform 44 corresponding to the value B of the fourth resistor are obtained as turning-off time waveforms 42, 44 of the gate voltage Vge in the one test period T.

As shown by FIG. 4K, two waveforms: a waveform 46 corresponding to the value A of the third resistor and a waveform 48 corresponding to the value B of the fourth resistor are obtained as turning-off time waveforms 46, 48 of the collector-emitter current Ice in the one test period T.

As shown by FIG. 4L, two waveforms: a waveform 50 corresponding to the value A of the third resistor and a waveform 52 corresponding to the value B of the fourth resistor are obtained as turning-on time waveforms 50, 52 of the collector-emitter voltage Vce in the one test period T.

As shown by FIG. 4J, two waveforms: a waveform 41 corresponding to the value C of the first resistor and a waveform 43 corresponding to the value D of the second resistor are obtained as turning-on time waveforms 41, 43 of the gate voltage Vge in the one test period T.

As shown by FIG. 4K, two waveforms: a waveform 45 corresponding to the value C of the first resistor and a waveform 47 corresponding to the value D of the second resistor are obtained as turning-on time waveforms 45, 47 of the collector-emitter current Ice in the one test period T.

As shown by FIG. 4L, two waveforms: a waveform 49 corresponding to the value C of the first resistor and a waveform 51 corresponding to the value D of the second resistor are obtained as turning-off time waveforms 49, 51 of the collector-emitter voltage Vce in the one test period T. The waveforms 41 to 52 each indicate a change amount of a voltage or current being applied to the power semiconductor 100 per unit time, for example.

In one test which is, for example, one dynamic characteristic test, a dynamic characteristic can be tested under two patterns of gate voltage conditions. Therefore, in one dynamic characteristic test, the turning-off time collector-emitter voltage Vce can be evaluated under two patterns of the gate voltage condition, and the turning-on time collector-emitter voltage Vce also can be evaluated under two patterns of the gate voltage condition, as shown by FIG. 4J. Also, the collector-emitter current Ice can be evaluated in the same manner as the collector-emitter voltage Vce.

In a dynamic characteristic test on the power semiconductor 100, it is necessary to change a gate driving condition (e.g. gate resistance) according to the content of the dynamic characteristic test and a characteristic to be inspected. However, it takes time to determine the gate driving condition because this typically uses a relay.

For the gate drive circuit 3 or the test device 1 of the present embodiment, the gate signal Sge, the OFF resistance setting signals Sa, Sb, the OFF resistance switching signal Sc, the ON resistance setting signals Sd, Se, and the ON resistance switching signal Sf, etc., are inputted while the gate voltage Vge, the collector-emitter current Ice, and the collector-emitter voltage Vce are outputted, as illustrated in FIGS. 2 to 4L. With the gate drive circuit 3 and the test device 1 of the present embodiment, a dynamic characteristic can be tested under a plurality of gate driving conditions during the dynamic characteristic test. Accordingly, the test can be conducted efficiently.

Figure 5:
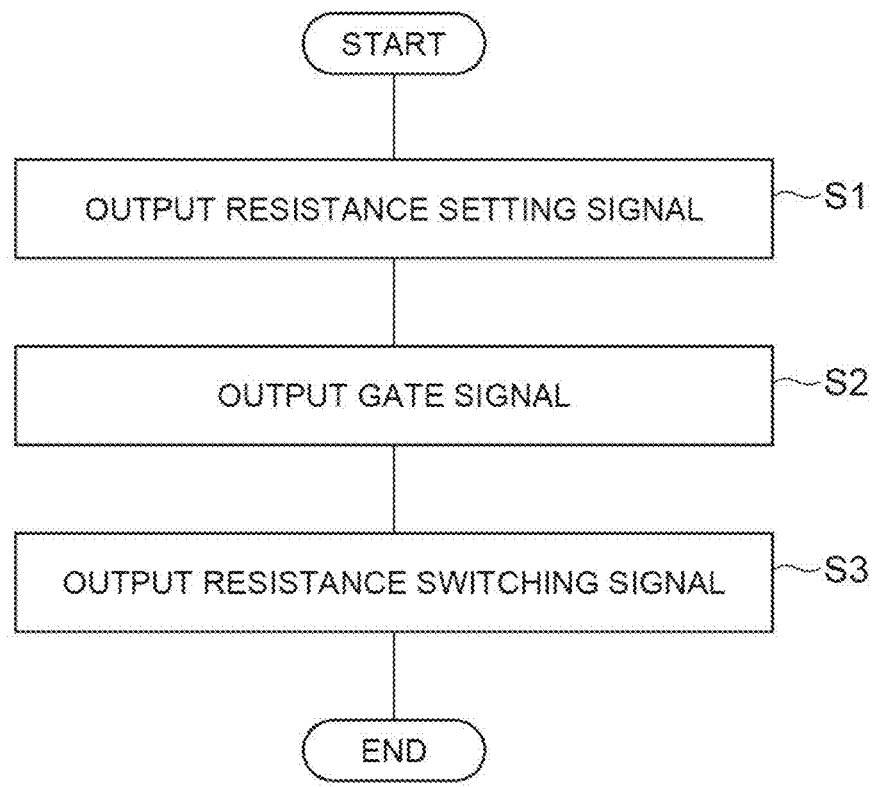
FIG. 5 is a flowchart illustrating a switching process.

Next, a switching process that is performed by the controller 2 during one dynamic characteristic test in a case where the gate signal Sge is set to an OFF signal, will be explained with reference to FIG. 5. FIG. 5 is a flowchart illustrating the switching process.

The switching process can be summarized as a switching method that is performed by the controller 2. The switching process includes a first step (step S1) of outputting a resistance switching signal, a second step (step S2) of outputting a gate signal Sge, and a third step (step S3) of outputting a resistance switching signal.

For example, it is assumed that the OFF resistance setting signals Sa, Sb, the OFF resistance switching signal Sc, the ON resistance setting signals Sd, Se, the ON resistance switching signal Sf, etc. are saved in the RAM of the controller 2.

For example, it is assumed that the OFF resistance setting signals Sa, Sb, the OFF resistance switching signal Sc, the ON resistance setting signals Sd, Se, the ON resistance switching signal Sf, etc. are transmitted from a device separate from the test device 1 through communication.

First, the controller 2 reads out the OFF resistance setting signals Sa, Sb and the ON resistance setting signals Sd, Se from the ROM, for example, and outputs the OFF resistance setting signals Sa, Sb and the ON resistance setting signals Sd, Se to the third resistance setting circuit 321 and the fourth resistance setting circuit 322 and the first resistance setting circuit 311 and the second resistance setting circuit 312 (step S1). Next, the controller 2 outputs the gate signal Sge (step S2).

Next, the controller 2 reads out the OFF resistance switching signal Sc and the ON resistance switching signal Sf from the RAM, for example, and outputs the OFF resistance switching signal Sc and the ON resistance switching signal Sf to the OFF resistance switching circuit 323 in the gate drive circuit 3 (step S3).

When the OFF resistance switching signal Sc and the ON resistance switching signal Sf are outputted, the OFF resistance switching circuit 323 switches the gate resistor to receive power application, from the third resistance setting circuit 321 to the fourth resistance setting circuit 322, or from the first resistance setting circuit 311 to the second resistance setting circuit 312, for example.

For example, step S1 may be executed by a resistance setting signal output unit, step S2 may be executed by a gate signal output unit, and step S3 may be executed by a resistance switching signal output unit. For example, the gate signal output unit, the resistance setting signal output unit, and the resistance switching signal output unit are programs saved in the ROM. When developed into the RAM, these programs are read out from the RAM by the CPU, and then, are executed. The gate signal output unit, the resistance setting signal output unit, and the resistance switching signal output unit may be logical circuits that are independent of one another.

It takes time to determine a gate driving condition because this typically uses a relay. A gate driving condition is previously determined prior to a dynamic characteristic test, and cannot be changed during the dynamic characteristic test. Since a gate driving condition cannot be changed during a dynamic characteristic test, a conventional device can measure a characteristic under only one gate driving condition in one dynamic characteristic test. A dynamic characteristic test in which the same operation is performed, also needs to be conducted multiple number of times while the gate driving condition is changed.

In the gate drive circuit 3 of the present embodiment, at least one of a plurality of resistance setting circuits connected in parallel with the voltage source and the power semiconductor 100 is connected to the voltage source and the power semiconductor 100 by a switching circuit such as the OFF resistance switching circuit 323, in the aforementioned manner.

Specifically in the gate drive circuit 3, either one of the third resistance setting circuit 321 and the fourth resistance setting circuit 322 connected in parallel with the OFF voltage source VGN and the gate of the power semiconductor 100 is connected to the OFF voltage source VGN and the gate of the power semiconductor 100 by the OFF resistance switching circuit 323, for example.

Accordingly, the resistance value between the voltage source and the gate of the power semiconductor 100 is derived not from all the resistance setting circuits parallelly connected, but from at least connected one of the resistance setting circuits by a switching circuit.

Specifically, the resistance value between the OFF voltage source VGN and the gate of the power semiconductor 100 is derived not from all the resistance setting circuits parallelly connected, but from the resistance setting circuit connected by the OFF resistance switching circuit 323, for example.

The gate drive circuit 3 switches connection of the plurality of resistance setting circuits connected with the voltage source and the gate of the power semiconductor 100 by using the switching circuits. Accordingly, the resistance value between the voltage source and the gate of the power semiconductor can be appropriately set.

Specifically, the gate drive circuit 3 switches connection of the plurality of resistance setting circuits connected with the voltage source VGN and the gate of the power semiconductor 100 by using the OFF resistance switching circuit 323, for example. Accordingly, the resistance value between the OFF voltage source VGN and the gate of the power semiconductor 100 can be appropriately set.

In the gate drive circuit 3, a change amount of a voltage or current being applied to the power semiconductor 100 per unit time, can be changed by the switching circuits, for example. Specifically in the gate drive circuit 3, a change amount of the gate voltage Vge, the collector-emitter current Ice, or the collector-emitter voltage Vce in the power semiconductor 100 per unit time can be changed by the ON resistance switching circuit 313 and the OFF resistance switching circuit 323, for example.

In the aforementioned manner, the gate drive circuit 3 of the present embodiment can electrically change the gate voltage Vge being applied to the gate of the power semiconductor 100. Accordingly, a dynamic characteristic test or the like can be efficiently conducted. This enables high-speed switching of a gate resistance. Therefore, a characteristic can be measured under a plurality of gate driving conditions in one test.

In addition, the test device 1 of the present embodiment includes the controller 2, the gate drive circuit 3, and the sensor 4, as previously explained. The controller 2 outputs the gate signal Sge to control the ON/OFF of the gate of the power semiconductor 100.

The sensor 4 measures the collector-emitter voltage Vce in the power semiconductor 100. The gate drive circuit 3 includes a voltage source, a plurality of resistance setting circuits, and a switching circuit. The plurality of resistance setting circuits are connected in parallel with the voltage source and the gate.

The switching circuit connects at least one of the resistance setting circuits to the voltage source and the gate. In the gate drive circuit 3, at least one of the plurality of resistance setting circuits connected in parallel with the voltage source and the gate of the power semiconductor 100 is connected to the voltage source and the gate of the power semiconductor 100 by the switching circuit.

The test device 1 of the present embodiment measures, for example, the collector-emitter voltage Vce in the power semiconductor in the aforementioned manner. To measure the collector-emitter voltage Vce in the power semiconductor, the gate drive circuit 3 switches connection of the plurality of resistance setting circuits connected to the voltage source and the gate of the power semiconductor by using the switching circuit. Accordingly, the resistance value between the voltage source and the gate of the power semiconductor can be set, as appropriate.

Since the test device 1 and the gate drive circuit 3 can electrically change the gate voltage Vge being applied to the gate of the power semiconductor 100 by using the switching circuits, the test device 1 and the gate drive circuit 3 can efficiently conduct a test on the power semiconductor in which, for example, the gate voltage Vge needs to be changed.

In a case where a switching circuit such as the OFF resistance switching circuit 323 includes a semiconductor element that operates in accordance with a switching signal such as the OFF resistance switching signal Sc, the gate drive circuit 3 can more speedily change the gate voltage Vge being applied to the gate of the power semiconductor 100, compared to a case where the switching circuit consists of a relay, etc. alone, without any semiconductor element.

The controller 2 may output a switching signal such as the OFF resistance switching signal Sc in one dynamic characteristic test, the one dynamic characteristic test being from the start to end of the gate signal Sge, and the switching circuit may connect at least one resistance setting circuit to the voltage source and the gate, the at least one resistance setting circuit being selected from among the plurality of resistance setting circuits in accordance with the OFF resistance switching signal Sc.

The test device 1 can change the gate voltage Vge being applied to the gate by using the switching circuits in a test such as a dynamic characteristic test. Accordingly, a dynamic characteristic test on the power semiconductor 100 in which, for example, the gate voltage Vge needs to be changed, can be efficiently conducted.

The aforementioned test device 1 or the gate drive circuit 3 of the embodiment represents an aspect of the embodiment. The test device 1 is not limited to the aforementioned embodiment. Within the concept set forth in the claims, the test device 1 or the gate drive circuit 3 of the embodiment can be modified or applied to any other device or circuit.

For example, the OFF resistance circuit 32 includes two resistance setting circuits which are the third resistance setting circuit 321 and the fourth resistance setting circuit 322 in the above explanation. However, the OFF resistance circuit 32 may include three or more resistance setting circuits. Similarly, the ON resistance circuit 31 may include three or more resistance setting circuits.

The OFF resistance switching circuit 323 and the ON resistance switching circuit 313 may each select at least one of the three or more resistance setting circuits, and connect the selected resistance setting circuit between the OFF voltage source VGN and the gate of the power semiconductor 100. By making a selection from among the three or more resistance setting circuits, the test device 1 can switch the gate resistance more precisely.

Not only the switching circuits but also the resistance setting circuits may include semiconductor elements. In a case where the resistance setting circuit includes a semiconductor element, the gate drive circuit 3 can more speedily change the gate voltage Vge being applied to the gate of the power semiconductor 100, compared to a case where the resistance setting circuit consists of a relay, etc. alone, without any semiconductor element.

Furthermore, the above semiconductor element does not need to be a transistor having an emitter, a collector, and a base, and may be a field effect transistor which is, for example, an IGBT including an emitter, a collector, and a gate, or a metal-oxide-semiconductor field effect transistor (MOSFET) including a drain, a source, and a gate.

REFERENCE SIGNS LIST

1 . . . test device, 2 . . . controller, 3 . . . gate drive circuit, 4 . . . sensor, 100 . . . power semiconductor.

What is claimed is:

1. A test device for use in a dynamic characteristic test on a power semiconductor, the test device comprising:
   a controller configured to output a gate signal to control ON/OFF of a gate of the power semiconductor;
   a gate drive circuit configured to apply a gate voltage to the gate in accordance with the gate signal outputted from the controller; and
   a sensor configured to measure a collector-emitter voltage in the power semiconductor, wherein
   the gate drive circuit comprises
      a voltage source configured to change a gate voltage of the gate,
      a plurality of resistance setting circuits connected in parallel with the voltage source and the gate, and
      a switching circuit connecting at least one resistance setting circuit of the resistance setting circuits to the voltage source and the gate.

2. The test device according to claim 1, wherein
   the controller outputs a switching signal during one dynamic characteristic test, the one dynamic characteristic test being from start to end of the gate signal, and
   the switching circuit connects at least one resistance setting circuit to the voltage source and the gate, the at least one resistance setting circuit being selected from among the plurality of resistance setting circuits in accordance with the switching signal.

3. A switching method to be performed by the controller included in the test device according to claim 1, the method comprising:
   a first step of outputting a resistance setting signal;
   a second step of outputting a gate signal; and
   a third step of outputting a resistance switching signal.

* * * * *